United States Patent
Long et al.

(10) Patent No.: US 7,883,583 B2
(45) Date of Patent: *Feb. 8, 2011

(54) VAPORIZATION APPARATUS WITH PRECISE POWDER METERING

(75) Inventors: Michael Long, Hilton, NY (US);
Thomas W. Palone, Rochester, NY (US); Bruce E. Koppe, Caledonia, NY (US); Michael L. Boroson, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 588 days.

This patent is subject to a terminal disclaimer.

(21) Appl. No.: 11/970,548

(22) Filed: Jan. 8, 2008

(65) Prior Publication Data

US 2009/0176016 A1  Jul. 9, 2009

(51) Int. Cl.
| | |
|---|---|
| C23C 16/448 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl. .................. 118/726; 156/345.29
(58) Field of Classification Search ........... 118/723 VE, 118/726
See application file for complete search history.

(56) References Cited

U.S. PATENT DOCUMENTS

| | | | | |
|---|---|---|---|---|
| 2,190,592 | A * | 2/1940 | Clayton | 252/367.1 |
| 2,191,255 | A * | 2/1940 | Bonotto | 34/493 |
| 2,233,109 | A * | 2/1941 | Ness et al. | 48/38 |
| 2,241,425 | A * | 5/1941 | Schmidt | 239/218.5 |
| 2,392,764 | A * | 1/1946 | Reeves | 208/153 |
| 2,665,168 | A * | 1/1954 | Kerlin | 239/2.1 |
| 2,743,158 | A * | 4/1956 | Webb et al. | 423/257 |
| 2,771,836 | A * | 11/1956 | Denehie et al. | 99/323.7 |

(Continued)

FOREIGN PATENT DOCUMENTS

EP    0982411    1/2000

(Continued)

OTHER PUBLICATIONS

Danilchenko et al.: "Method of Discrete Evaporation in Vacuo", Instruments and Experimental Techniques., May 1968, pp. 721-722, XP-002521079.

*Primary Examiner*—Rudy Zervigon
(74) *Attorney, Agent, or Firm*—Morgan, Lewis & Bockius LLP

(57) ABSTRACT

Apparatus for vaporizing a particulate material, comprising a metering apparatus including: a reservoir; a housing having an internal volume and first and second openings for respectively receiving and discharging the particulate material; a rotatable shaft disposed in the internal volume, the shaft having a smooth surface and a circumferential groove for receiving particulate material from the reservoir and for discharging the particulate material; the rotatable shaft and the internal volume cooperating such that the particulate material is transported by the circumferential groove and not along the remainder of the rotatable shaft; a scraper disposed in relation to the second opening, having at its end substantially the same cross section as the groove in the rotating shaft, the scraper cooperating with the groove to dislodge particulate material retained therein, and in response to the shaft rotating, delivers metered amounts of particulate material through the second opening; to the flash evaporator.

17 Claims, 12 Drawing Sheets

U.S. PATENT DOCUMENTS

| | | | | |
|---|---|---|---|---|
| 3,754,529 | A * | 8/1973 | Fleischner | 118/726 |
| 4,532,272 | A * | 7/1985 | Wilt et al. | 523/330 |
| 4,616,055 | A * | 10/1986 | Mason | 524/381 |
| 4,769,292 | A | 9/1988 | Tang et al. | |
| 4,885,211 | A | 12/1989 | Tang et al. | |
| 5,090,498 | A * | 2/1992 | Hamill | 175/206 |
| 5,709,827 | A * | 1/1998 | Andersen et al. | 264/42 |
| 6,383,301 | B1 * | 5/2002 | Bell et al. | 118/716 |
| 6,470,737 | B1 * | 10/2002 | De Bona et al. | 73/64.56 |
| 6,685,762 | B1 * | 2/2004 | Brewster et al. | 75/331 |
| 6,734,142 | B2 * | 5/2004 | Massmann et al. | 504/206 |
| 6,832,887 | B2 | 12/2004 | Baer et al. | |
| 7,044,288 | B2 | 5/2006 | Baer et al. | |
| 7,141,532 | B2 * | 11/2006 | Graham et al. | 504/206 |
| 7,288,285 | B2 * | 10/2007 | Long et al. | 427/248.1 |
| 7,288,286 | B2 * | 10/2007 | Long et al. | 427/248.1 |
| 7,501,151 | B2 * | 3/2009 | Long et al. | 427/248.1 |
| 7,501,152 | B2 * | 3/2009 | Long et al. | 427/248.1 |
| 7,625,601 | B2 * | 12/2009 | Long et al. | 427/248.1 |
| 7,625,602 | B2 * | 12/2009 | Long et al. | 427/248.1 |
| 7,638,168 | B2 * | 12/2009 | Boroson et al. | 427/248.1 |
| 2006/0062915 | A1 * | 3/2006 | Long et al. | 427/248.1 |
| 2006/0062918 | A1 * | 3/2006 | Long et al. | 427/255.6 |
| 2006/0062919 | A1 * | 3/2006 | Long et al. | 427/255.6 |
| 2006/0157322 | A1 | 7/2006 | Baer et al. | |
| 2006/0177576 | A1 | 8/2006 | Long et al. | |
| 2006/0251811 | A1 * | 11/2006 | Long et al. | 427/248.1 |
| 2007/0084700 | A1 | 4/2007 | Baer et al. | |
| 2007/0092645 | A1 * | 4/2007 | Long et al. | 427/248.1 |
| 2007/0104864 | A1 * | 5/2007 | Boroson et al. | 427/184 |
| 2009/0081365 | A1 * | 3/2009 | Cok et al. | 427/255.6 |
| 2009/0176016 | A1 * | 7/2009 | Long et al. | 427/248.1 |
| 2010/0122656 | A1 * | 5/2010 | Long et al. | 118/712 |
| 2010/0122658 | A1 * | 5/2010 | Long et al. | 118/724 |
| 2010/0122659 | A1 * | 5/2010 | Long et al. | 118/726 |

FOREIGN PATENT DOCUMENTS

JP     2003 193218 A     7/2003

* cited by examiner

VAPORIZATION APPARATUS WITH PRECISE POWDER METERING

FIELD OF THE INVENTION

The present invention relates to metering of powdered materials, over a large range of feed rates, into a vaporization apparatus.

BACKGROUND OF THE INVENTION

There is a need to be able to accurately and precisely continuously meter small quantities of powdered materials, for example 1 to 9 micrograms per second. The electronics industry has a need to meter small quantities of powdered materials to a vaporization zone for direct vapor deposition or for precursors in chemical vapor deposition (CVD). There is also a need to be able to accurately and precisely meter material amounts three orders of magnitude higher, for example 1000 micrograms per second. In many systems, it would be advantageous to be able to meter powdered materials over the range of 1 to 1000 micrograms with the same equipment. Organic light emitting diode devices (OLEDs), for instance have a light emitting layer that often contains a host and a dopant that are deposited in amounts differing by two to three orders of magnitude. There would be a great advantage in OLED manufacturing to be able to independently, and continuously, meter powdered organic materials to a vaporization region using a common transport design for host, co-host and dopant materials.

It is well known that precisely metering small amounts of powdered materials is difficult. There are numerous examples of systems that make use additional materials as carriers and additives to facilitate the transport of powdered materials. Carriers that have been used include inert gases, liquids, and solids. The use of any sort of additive increases the material transport complexity, for the carrier or additive needs to be added, removed and handled separately from the actual material of interest. The use of carriers also increases the risk of contamination, which is particularly detrimental in the pharmaceutical and electronics manufacturing industries where there is a particular need to meter materials.

In U.S. Pat. No. 3,754,529, Fleischner describes an auger device for transporting powdered material that has been mixed with an inert carrier, preferably sand. The ratio of active material to sand is reported to be 1:9. Transporting a mixture that is mostly inert carrier adds costs and complexities to the system, and increases the potential for the introduction of contaminates into the material feed.

Commonly assigned U.S. Patent Application Publication Nos. 2006/0062918 and No. 2006/0177576 use a traditional auger design to meter powders, where there is a patterned screw within a smooth barrel. FIG. 1 shows a cross-sectional view of a typical prior art auger structure showing a patterned auger screw 5 within a smooth barrel 7. Auger screw 5 of an auger structure 8 is turned by a motor (not shown). The distance between the threads of the screw helix and the thread height are chosen to be sufficiently large that powder tends not to pack into and rotate with the helix, but rather to remain at the bottom of the horizontally oriented auger barrel 7 and is transported linearly by virtue of the relative motion between auger screw 5 and auger barrel 7. In the horizontal orientation as shown, the powdered material travels primarily along the bottom of auger screw 5 in a tumbling and dispersed form. The terminal end of auger screw 5 can be configured to have a thread-free portion 9 as shown having a constant circular cross section over a small length to constrain the consolidated powder to form a narrow annular or tubular shape. One of the problems with using this type of auger structure with powders is varying discharge rate. The discharge rate has been observed to vary cyclically with the angular orientation of auger screw 5. The quantity of material discharged by the auger from revolution to revolution is quite reproducible, but within a revolution it is quite variable. In the horizontal orientation, more powder resides in the lower half of the auger barrel than resides in the upper half and this can accentuate the cyclic discharge. Using the auger in a vertical orientation such that the powder is evenly distributed around the interior of the auger barrel can attenuate the cyclic discharge, but the cyclical variation remains and the mechanical drive arrangement for the auger and agitator is more complicated.

The metering device of this disclosure can also be used as one part of a larger vapor deposition system. Vapor deposition systems of particular interest are those designed for manufacturing organic light emitting diode (OLED) devices. An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal way of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate-dependent vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. In the prior art, it has been necessary to vent the deposition chamber, disassemble and clean the vapor source, refill the source, reestablish vacuum in the deposition chamber and degas the just-introduced organic material over several hours before resuming operation. The low deposition rate and the frequent and time-consuming process associated with recharging a source has placed substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. Additionally, the standard use of separate sources creates a gradient effect in the deposited film where the material in the source closest to the advancing substrate is over-represented in the initial film immediately adjacent the substrate while the material in the last source is over represented in the final film surface. This gradient co-deposition is unavoidable in prior art sources where a single material is vaporized from each of multiple sources directly onto a substrate. The gradient in the deposited film is especially evident when the contribution of either of the end sources is more than a few percent of the central source, such as when a co-host is used. FIG. 2 shows a cross-sectional view of such a prior-art vaporization device 10, which includes three individual sources 11, 12, and 13 for vaporizing organic material. Vapor plume 14 is preferably homogeneous in the materials from the different sources, but in fact varies in composition from side to side resulting in a non-homogeneous coating on substrate 15.

Commonly assigned U.S. Patent Application Publication Nos. 2006/0062918 and No. 2006/0062919 overcome many of the shortcomings of the use of separate point sources by metering materials to a flash vaporization zone. U.S. Patent Application Publication No. 2006/0062918 teaches the metering of host and dopant mixtures in a single powder transport mechanism, and using a manifold to distribute the vapor to the substrate. U.S. Patent Application Publication No.2006/062919 discloses the ability to mix organic vapors in the manifold and deliver a mixture of materials to the substrate surface. However, none of these earlier teachings anticipate the need to have independent metering control for the host and dopant materials. The transport mechanisms are therefore unable, by virtue of design, to meter at the low rates, 1-10 micrograms/second, required for an independent dopant feed.

U.S. Patent Application Publication Nos. 2007/0084700 and 2006/0157322, U.S. Pat. Nos. 6,832,887 and 7,044,288 disclose powder feeding pumps for moving powders from an entry port to a discharge port using parallel spaced disks that rotate within a housing having an internal cavity that defines a volume having an increasing volume from the input port to the discharge port. These powder feeding pumps are intended for use with much larger particle size powders and are not adapted to metering powder on a milligram or microgram basis.

There continues to be a need to precisely control the metering of milligram to microgram quantities of powdered material into a vaporization apparatus.

SUMMARY OF THE INVENTION

It is therefore an object of the present invention to precisely control the metering and delivery of milligram to microgram quantities of powder to a vaporization device.

This object is achieved by an apparatus for vaporizing a particulate material, comprising:
(a) a metering apparatus including:
 (i) a reservoir for receiving particulate material;
 (ii) a housing having an internal volume and having first and second openings for respectively receiving the particulate material from the reservoir and for discharging the particulate material;
 (iii) a rotatable shaft disposed in the internal volume, the shaft having a smooth surface and a circumferential groove aligned with the first and second openings for receiving particulate material from the reservoir and for discharging the particulate material;
 (iv) the rotatable shaft and the internal volume cooperating such that the particulate material is substantially transported by the circumferential groove and not along the remainder of the rotatable shaft; and
 (v) a scraper disposed in relation to the second opening, having at its end substantially the same cross section as the groove in the rotating shaft, the scraper cooperating with the groove to dislodge particulate material retained therein, and in response to the shaft rotating, delivers metered amounts of particulate material through the second opening; and
(b) a flash evaporator that receives and vaporizes the metered material.

It is an advantage of this invention that it can provide adjustable controlled metering and vaporization of small quantities of powdered material more uniformly than has heretofore been possible. The particulate material transport apparatus of the present invention has a unique feature in that it can deliver small amounts of powdered material such as 1 microgram per second, as well as much larger amounts, such as up to 1000 micrograms per second. It is a further advantage of the present invention that it can meter powders uniformly without the use of a carrier, such as an inert gas, liquid or solid. It is a further advantage of the present invention that it can maintain a steady vaporization rate with a continuously replenished charge of organic material and with no heater temperature change required as the source material is consumed. It is a further advantage of the present invention that the particulate material is maintained at room temperature in the material reservoir and the transport apparatus and is heated only as it is discharged into the associated vaporization apparatus. The device permits extended operation of the source with substantially higher vaporization rates than in prior art devices with substantially reduced risk of degrading even very temperature-sensitive organic materials. It is a further advantage of the present invention that it can be used in a vaporization system for independently controlling dopant and host feed rates. It is a further advantage of this invention that it permits rapid starting and stopping of vaporization. It is a further advantage of this invention that it can deliver controlled volumes of vapor and thereby control the deposited film thickness in area deposition processes. It is a further advantage of the present invention that it can provide a vapor source in any orientation, which is frequently not possible with prior-art devices.

DETAILED DESCRIPTION OF THE INVENTION

Figure 1:
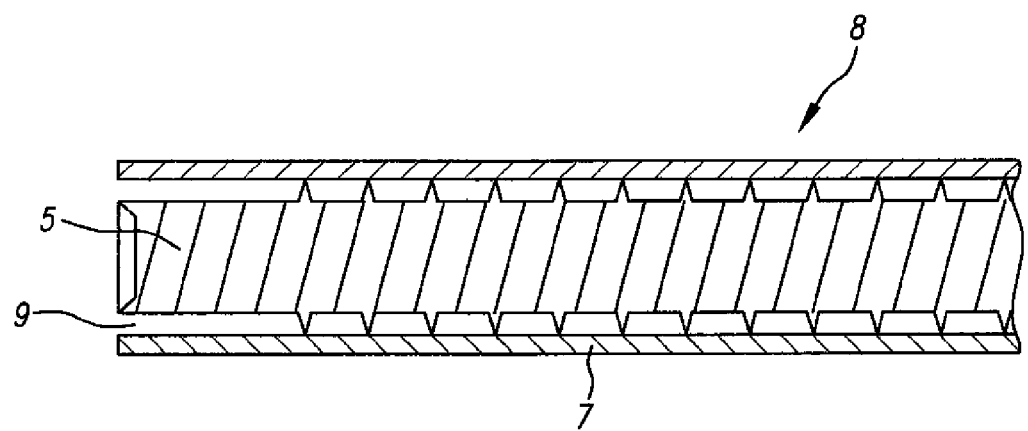
FIG. 1 shows a cross-sectional view of a prior-art vaporization device.
Figure 2:
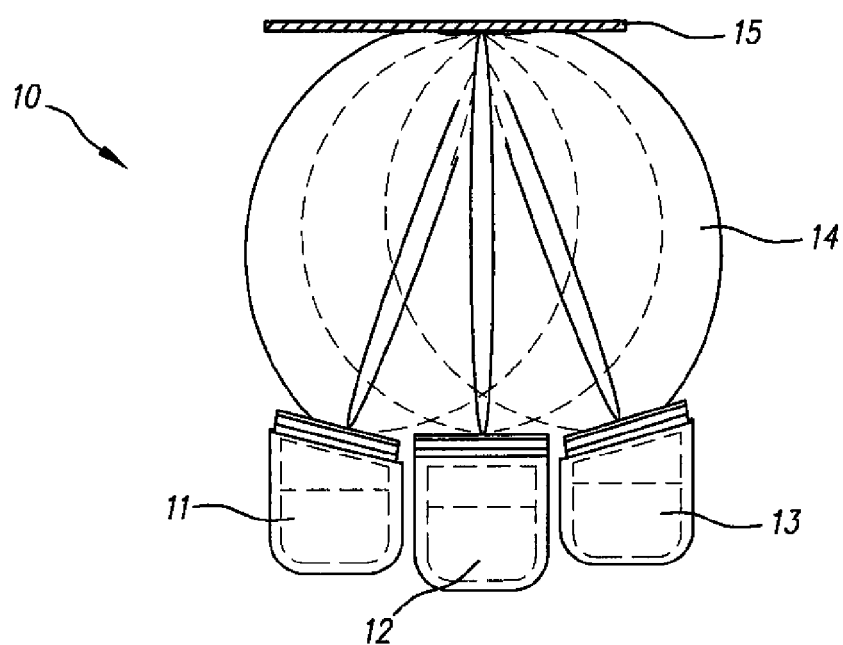
FIG. 2 shows a cross-sectional view of the terminal end of a prior art powder feeding apparatus.
Figure 3:
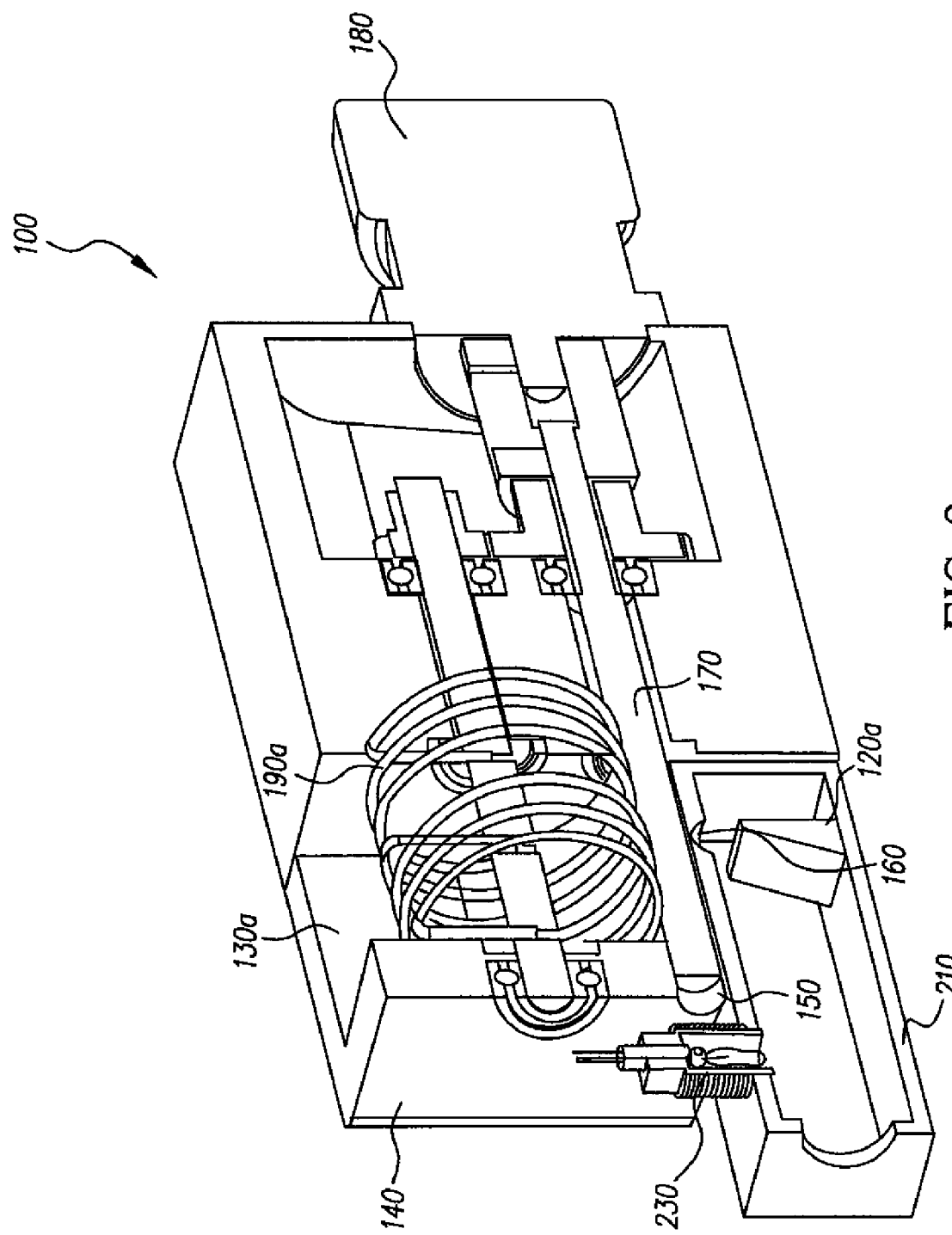
FIG. 3 shows a cutaway view of one embodiment of an apparatus according to the present invention.

Turning now to FIG. 3, there is shown a cutaway view of one embodiment of an apparatus according to the present invention. Vaporizing apparatus 100 is an apparatus for vaporizing particulate material. Vaporizing apparatus 100 includes a metering apparatus, which includes: a reservoir for receiving particulate material; a housing having an internal volume and first and second openings; a rotatable shaft disposed in the internal volume having a shape corresponding to that of the internal volume and a circumferential groove; and a scraper having at its end substantially the same cross section as the groove in the rotating shaft. These components will be described in more detail. Reservoir 130a is for receiving particulate material. The particulate material can include a single component, or can include two or more different material components, each one having a different vaporization temperature. Although not shown, reservoir 130a can include a larger storage and feeding apparatus above it to increase the volume of particulate material that can be loaded. Such containers and feeding apparatus have been described by Long et al. in commonly assigned U.S. Pat. No. 7,288,285. Reservoir 130a is in housing 140 and includes an agitator 190a that fluidizes the particulate material in reservoir 130a. Housing 140 is preferably constructed of thermally conductive material, such as aluminum, which can be actively cooled and serves to maintain the particulate material in reservoir 130a at a temperature well below the effective vaporization temperature of the particulate material. The feed rate uniformity is improved when the particulate material in proximity to the infeed portion of a rotatable shaft 170 is fluidized by agitation. This can be accomplished by slowly agitating the particulate material with agitator 190a or by inducing vibration, e.g. by a piezoelectric structure that is tuned to induce liquid-like behavior of the particulate material but is not so energetic as to cause gas-like behavior. Agitator 190a can be a rotating helical wire, which is well adapted to feeding mixed-component particle materials as it imparts very little energy to the powder and is therefore not likely to cause particle separation by size or density. For best results, agitator 190a is desirably spaced from 0.01 to 2 mm from rotatable shaft 170 and is substantially tangent to the surface of the shaft 170. The rotational speed of agitator 190a can vary depending on the particle size and properties of the particular particulate material.

Housing 140 also includes an internal volume 150. Rotatable shaft 170 has a smooth surface and a shape corresponding to that of internal volume 150, e.g. cylindrical in this embodiment, and is disposed in internal volume 150. Rotatable shaft 170 also has a circumferential groove, which shall become apparent in further drawings. Rotatable shaft 170 is preferably constructed of thermally conductive material such as nickel that can be actively cooled and serves to maintain the particulate material in the circumferential groove at a temperature well below the effective vaporization temperature of the particulate material. Hard coatings such as titanium nitride or diamond-like carbon are advantageously applied to the internal volume 150 and the rotatable shaft 170. A motor 180 rotates rotatable shaft 170 at a predetermined rate. Motor 180 can also be used to rotate agitator 190a. Housing 140 also includes first and second openings whose nature and function will become apparent. Vaporizing apparatus 100 also includes a flash evaporator 120a within an evaporator enclosure 210. Vaporizing apparatus 100 can further optionally include pressure sensor 230, which can be used to monitor the rate of material vaporization.

Figure 4:
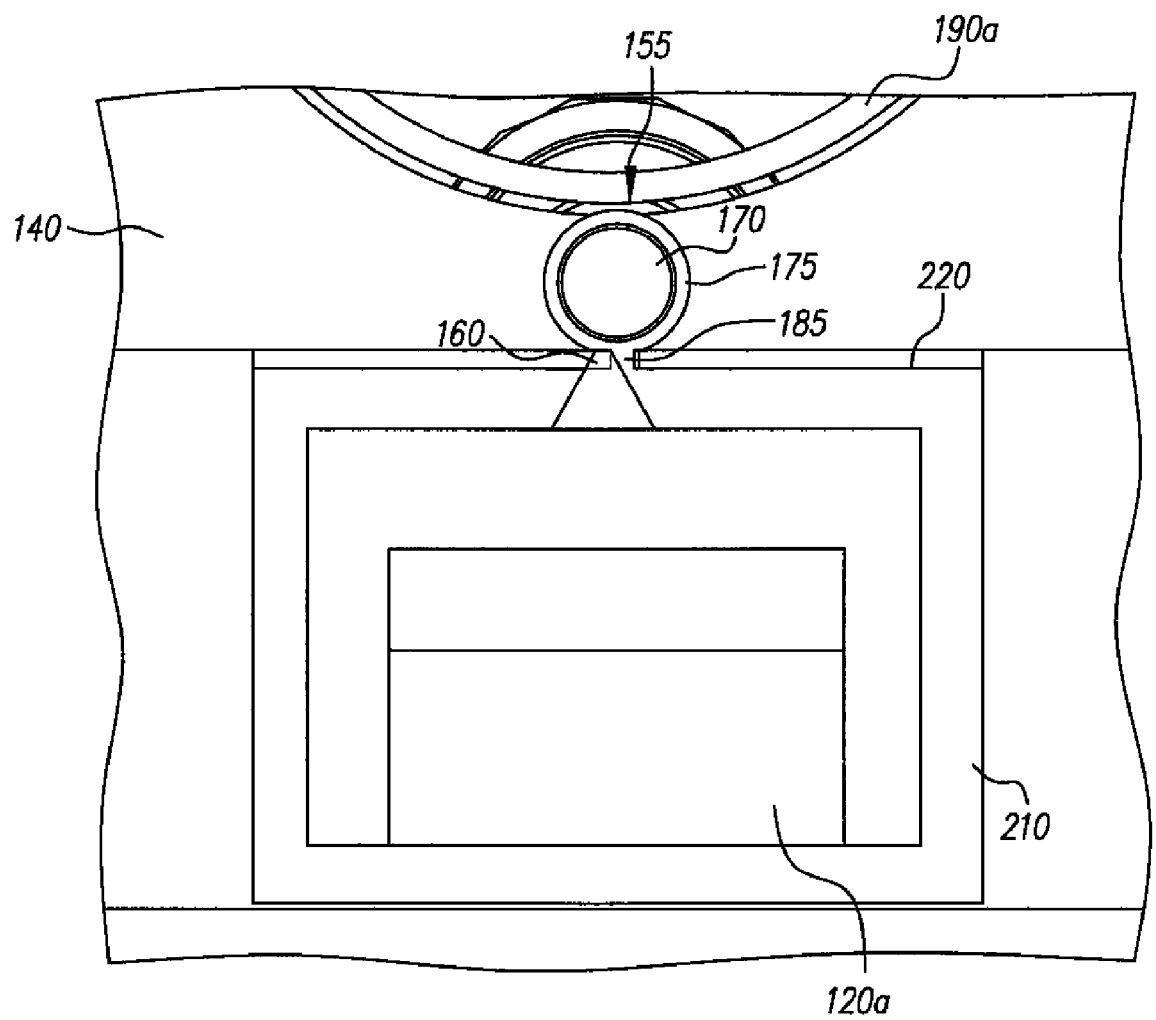
FIG. 4 shows a cross-sectional view of a portion of the inventive apparatus of FIG. 3.

Turning now to FIG. 4, there is shown a cross-sectional view of a portion of the inventive apparatus of FIG. 3 in the plane of the circumferential groove of rotatable shaft 170. Housing 140 has first opening 155 and second opening 160. Circumferential groove 175 in rotatable shaft 170 is aligned with first opening 155 and second opening 160. Desirably, rotatable shaft 170 includes only a single groove. First opening 155 receives particulate material from reservoir 130a into circumferential groove 175. It is desirable to include a device disposed in reservoir 130a for filling and compressing the particulate material in groove 175. Agitator 190a, which serves to fluidize the particulate material in reservoir 130a, can also serve this function by sweeping particulate material into groove 175 at first opening 155. Rotatable shaft 170 rotates in a counter-clockwise direction in this embodiment. Second opening 160 permits the discharge of particulate material from circumferential groove 175 so as to deliver metered amounts of the particulate material to flash evaporator 120a. The dimensions of circumferential groove 175, the dimensions of the particulate material, and the rotation rate of rotatable shaft 170 determine the rate of metering the particulate material to flash evaporator 120a. Circumferential groove 175 desirably has a width in the range of from 0.01 to 2 mm and a depth of from 0.01 to 5 mm. A scraper 185 is disposed in relation to second opening 160 so as to cooperate with groove 175 as the shaft rotates to dislodge particulate material retained in the groove to deliver metered amounts of the particulate material to flash evaporator 120a, which receives and vaporizes the metered material. Flash evaporator 120a is desirably reticulated vitreous carbon as described by Long et al. in commonly assigned U.S. patent application Ser. No. 11/834,039 or reticulated nickel, tungsten, titanium, molybdenum or tantalum. Flash evaporator 120a can be heated directly. Alternatively, evaporator enclosure 210 can be heated, whereby scraper 185 can also be heated. Reservoir 130a and housing 140 can be actively cooled. Circumferential groove 175, and particulate material entrained in it, can be maintained at a temperature below the desired vaporization temperature of the powdered material by the active cooling. Because only a small portion of particulate material-the portion that reaches and falls through second opening 160-is heated to the rate-dependent vaporization temperature, while the bulk of the material is kept well below the vaporization temperature, it is possible to rapidly stop and start the vaporization by stopping and starting the rotation of rotatable shaft 120a. The vaporization can be stopped when a substrate surface is not being coated so as to conserve organic material and minimize contamination of any associated apparatus, such as the walls of a deposition chamber, which will be described below. This is an advantage over prior art devices that use temperature to control the rate of vaporization, and which do not permit rapid stopping and starting, or rapid rate of vaporization change. It is also useful to have an insulator 220 between evaporator enclosure 210 and housing 140 to reduce heat transfer to the housing. Insulator 220 can include synthetic mica such as that marketed by the Cogebi Group, an insulating ceramic material, a thin gap, or simply light contact between enclosure 210 and housing 140.

The residence time of the material at elevated temperature, that is, at the rate-dependent vaporization temperature, is orders of magnitude less than many prior art devices and methods (seconds vs. hours or days in the prior art), which permits heating material to higher temperatures than in the prior art. Thus, the current device and method can achieve substantially higher vaporization rates, without causing appreciable degradation of the organic material components because the product of exposure time and temperature is substantially lower than in prior art devices.

Figure 5:
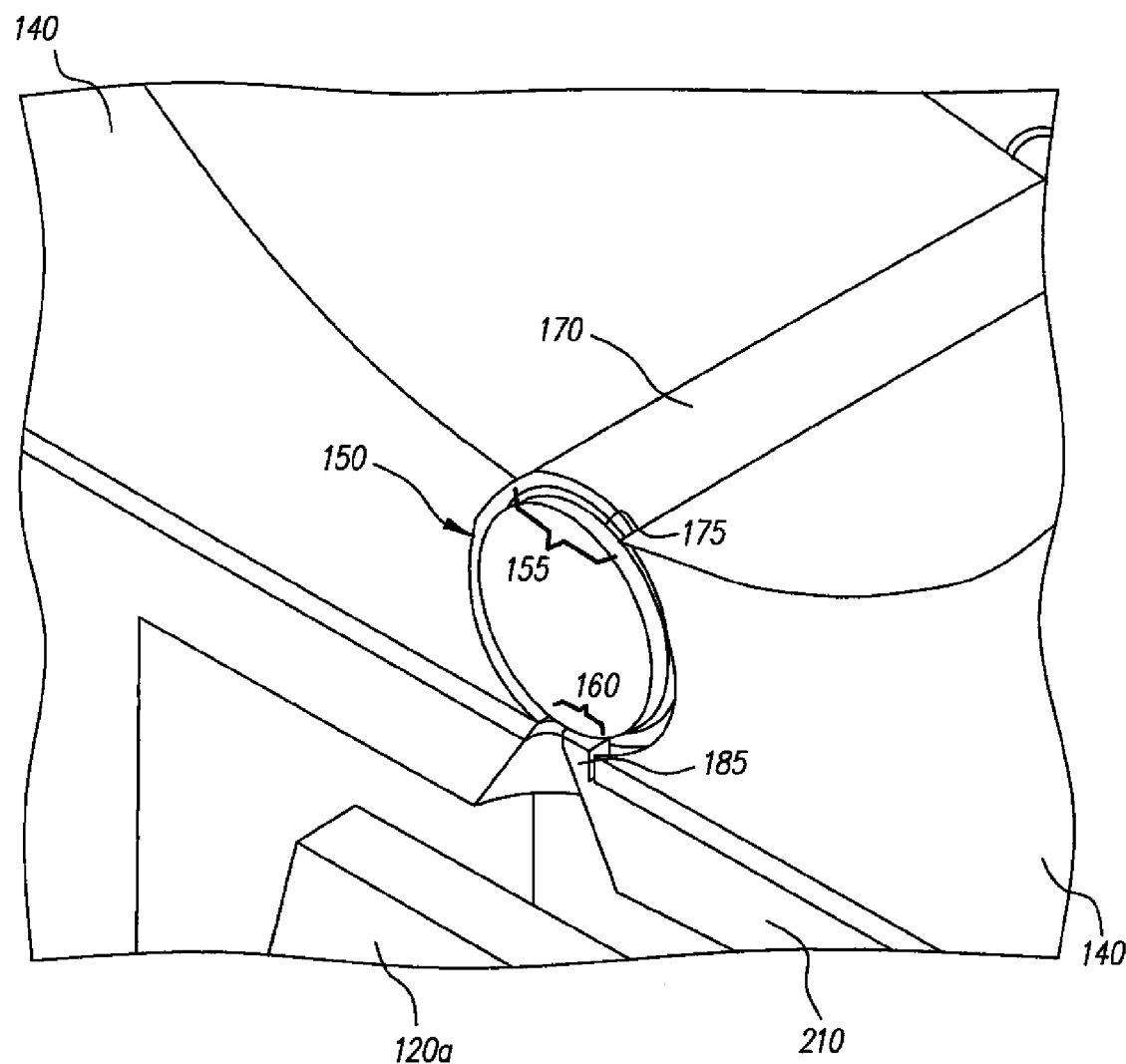
FIG. 5 shows a three-dimensional cross-sectional view of a portion of the inventive apparatus of FIG. 3.

Turning now to FIG. 5, there is shown a three-dimensional cross-sectional view of a portion of the inventive apparatus of FIG. 3. It can be seen that scraper 185 has at its end substantially the same cross-section as circumferential groove 175 so as to best dislodge particulate material from the groove.

It is important for the purposes of this invention to limit the transfer of particulate material by rotatable shaft 170 to the region of circumferential groove 175. Rotatable shaft 170 and internal volume 150 cooperate such that the particulate material will be substantially transported by circumferential groove 175 and not along the remainder of rotatable shaft 170. By this it is meant that the spacing between rotatable shaft 170 and housing 140 is chosen to be smaller than the average particle size of the particulate material so as to substantially exclude particulate material transfer from all parts of shaft 170 outside of circumferential groove 175.

Figure 6:
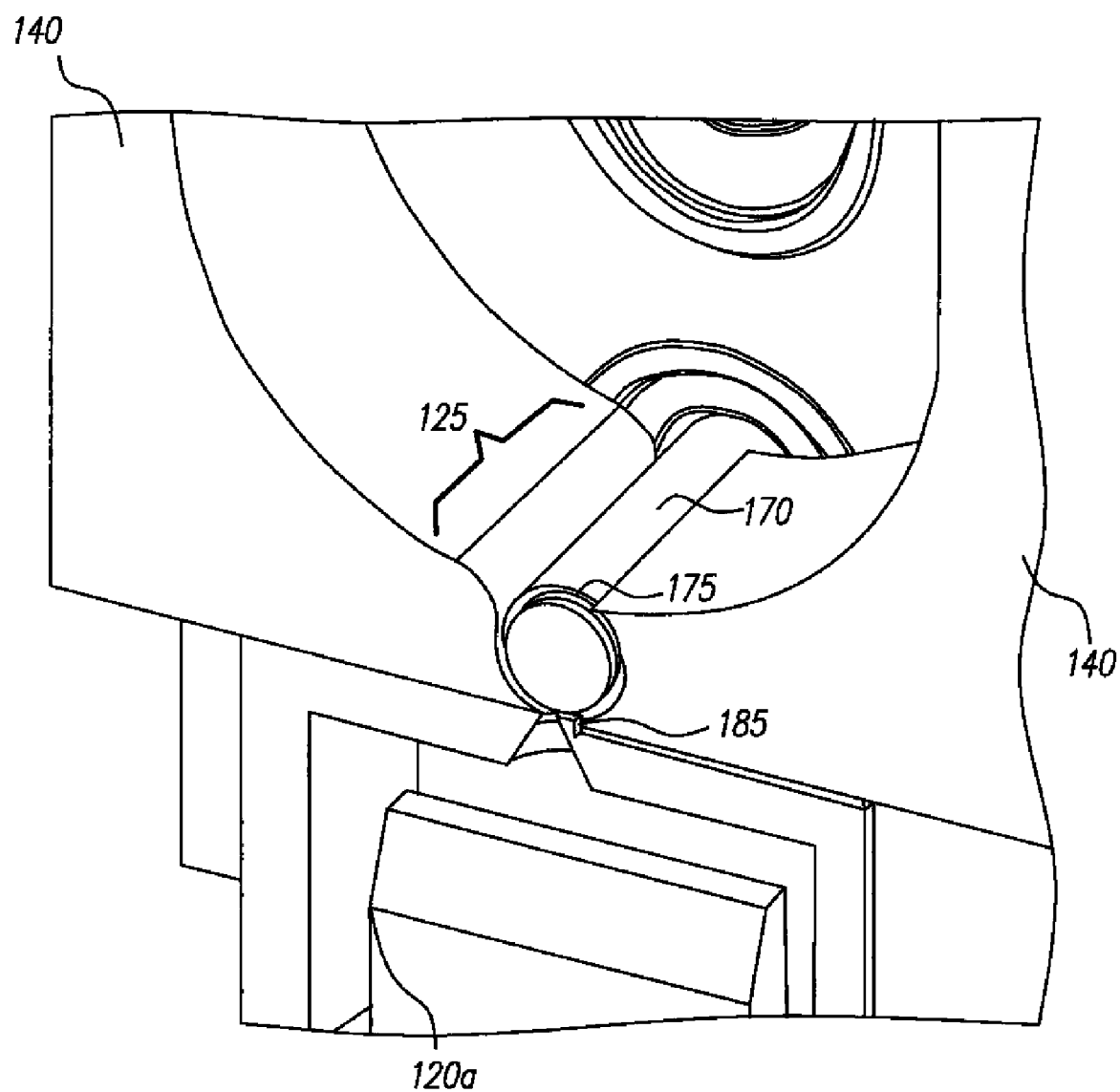
FIG. 6 shows a three-dimensional cross-sectional view of another embodiment of an apparatus according to the present invention.
Figure 7:
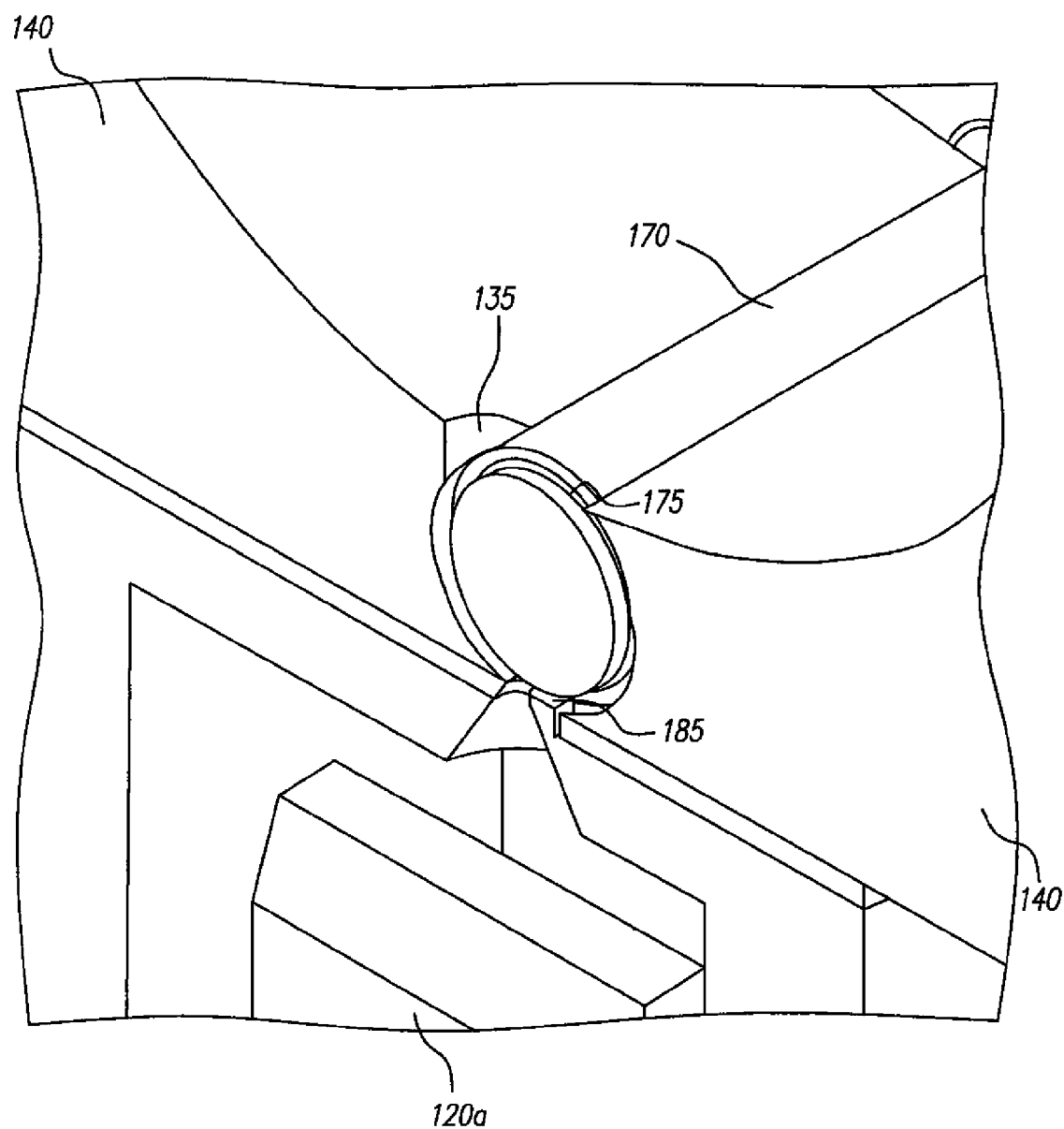
FIG. 7 shows a three-dimensional cross-sectional view of another embodiment of an apparatus according to the present invention.

Second opening 160 is sized to have substantially the same width as circumferential groove 175 in rotatable shaft 170, and the opening has an increasing cross sectional area as it penetrates into evaporator enclosure 210 to encourage the material dislodged from the groove by scraper 185 to fall into evaporator enclosure 210 without clinging to the walls of the opening. The immediate proximity or light contact between rotatable shaft 170, scraper 185, and second opening 160 of both housing 140 and evaporator enclosure 210 creates a positive displacement metering configuration that forces the material out of the groove and into evaporator enclosure 210 without reliance on gravity.

The material feeding and vaporizing device of this disclosure is effective at transporting particulate material when the grooved shaft is horizontal as shown in FIGS. 3-9, but it can also be used in other orientations. The particulate material is forced into the groove and is retained therein sufficiently well to make its operation gravity-independent for many materials. This particulate material retention force is sufficient that a scraper is necessary to dislodge the particulate material and permits the particulate material to be dispensed vertically upward against the force of gravity. In an embodiment wherein the grooved shaft is oriented vertically, the particulate material will fall from the second opening 160, along the tapered walls of evaporator enclosure 210 onto flash evaporator 120*a* oriented to receive the particulate material. These characteristics are significant in enabling the controlled vaporization of mixed component organic materials, and organic materials that liquefy before vaporizing.

Experimentally, it has been observed that fine powder is considerably more difficult to meter in a partial vacuum below half an atmosphere. The powder agglomerates as residual air molecules are removed, and behaves more like a solid than a pourable powder. Despite this tendency, the material feeding and vaporizing device of this disclosure has proven capable of dispensing powders with a particle size dispersion below 50 microns as well as powders prepared to have particle size dispersions between 50 and 100 microns and between 100 and 200 microns.

Managing condensation in powder-fed vaporization systems is extremely important, as this is a primary cause of material feed problems and material degradation or fractionalization. Second opening 160 to evaporator enclosure 210 is made sufficiently large to permit the material to pass into the evaporator enclosure, but at less than 1 mm diameter, the opening is purposely made to have a low conductance to the backflow of vapor. At second opening 160, the material in circumferential groove 175 is in the form of a consolidated powder where it serves as a vapor seal, preventing vaporized material in the evaporator enclosure that has a pressure greater than the ambient vacuum level from flowing back along circumferential groove 175 to the particulate material reservoir. Scraper 185 is maintained at a temperature sufficient to prevent condensation, but a small amount of vapor will condense on the cold face of the particulate material still in the groove. Material vapor will additionally condense on the cooled shaft immediately adjacent the groove. All of the points of condensation in this device, however, are self limiting and confined to very small areas. After an initial vaporization period, the material feed per unit revolution will stabilize. The vapor that condenses on the cold face of the particulate material in the groove will be vaporized as soon as the shaft rotates farther to dislodge the material from the groove. Any vapor that condenses in the groove can accumulate to the point where it contacts the heated scraper and is mechanically removed from the groove as the shaft rotates. The condensate effectively reduces the groove dimensions until they perfectly conform to the scraper dimensions. The condensate accumulation is therefore self-limiting. Similarly, the vapor that condenses on the shaft will accumulate until it mechanically interferes with and is removed by the sharp edges of the first and second openings and likewise reaches a stable, self-limiting dimension.

This configuration substantially increases the attainable temperature gradient in the particulate material between the temperature of circumferential groove 175 and that of evaporator enclosure 210 with scraper 185. This gradient prevents the usual leaching of more volatile constituents from bulk volumes of mixed-component materials and enables a single source to co-deposit multiple-particulate materials. This large gradient is further instrumental in maintaining the particulate material in a consolidated powder form upon reaching second opening 160, even when employing materials that liquefy at temperatures as low as 100° C. After the desired quantity of material has been metered, rotatable shaft 170 can be rotated a few degrees in the reverse direction to separate the particulate material in circumferential groove 175 from contact with scraper 185 and shield the material within the cooled housing 140 from radiant heat emitted by evaporator enclosure 210. This action is further instrumental in maintaining the large thermal gradient for all of the particulate material. The small quantity of vapor that condenses in the empty portion of the exposed groove will be removed by scraper 185 when rotatable shaft 170 is again rotated in the feed direction.

In practice, vaporization apparatus 100 is used as follows. Particulate material is received in reservoir 130*a*. Rotatable shaft 170 as described above is rotated in internal volume 150, which is formed in housing 140 as described above, whereby circumferential groove 175 receives particulate material from reservoir 130*a* through first opening 155 and discharges it from second opening 160. Scraper 185 scrapes the particulate material from circumferential groove 175 to deliver metered amounts of particulate material through second opening 160 to evaporator enclosure 210 and flash evaporator 120*a*, wherein the metered particulate material is flash evaporated. In some embodiments, the position of scraper 185 can be adjusted to control the amount of metered material delivered through second opening 160.

Turning now to FIG. 6, there is shown a three-dimensional cross-sectional view of a portion of another embodiment of an apparatus according to the present invention. In this embodiment, a portion of housing 140 is so shaped to provide a wedge-shaped entrance 125 to provide some compression of particulate material as it feeds into circumferential groove 175 in the direction of rotation of rotatable shaft 170. Turning now to FIG. 7, there is shown a three-dimensional cross-sectional view of a portion of another embodiment of an apparatus according to the present invention. In this embodiment, housing 140 also has a wedge-shaped entrance 135. However, wedge-shaped entrance 135 is so shaped as to compress particulate material into circumferential groove 175 in the direction of rotation of rotatable shaft 170 and also in the direction perpendicular to the rotation. This reduces the possibility of material being caught between the housing and the rotatable shaft, which is possible with wedge-shaped entrance 125 in FIG. 6.

Figure 8:
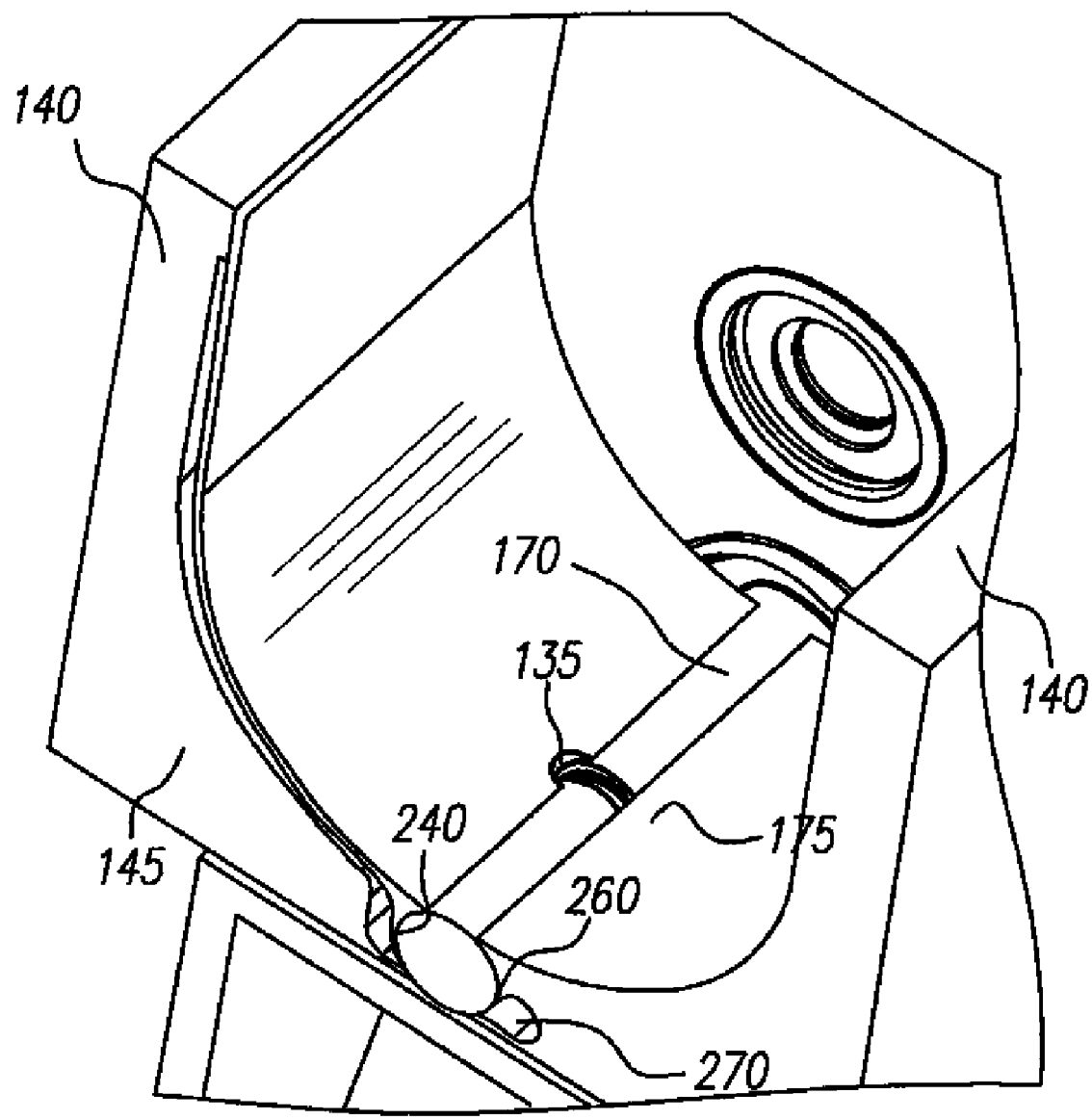
FIG. 8 shows a cross-sectional view of another embodiment of an apparatus according to the present invention.

Turning now to FIG. 8, there is shown a cross-sectional view of another embodiment of an apparatus according to the present invention. In this embodiment, a flexible wall 145 is attached to housing 140 and provides at least a portion of the perimeter of internal volume 240 within which rotatable shaft 170 is disposed. In this illustration, it provides the portion of the internal volume toward which rotatable shaft 170 is rotating and is therefore the portion of internal volume 240 that will first encounter trapped particulate material outside of the region of circumferential groove 175. If both the rotatable shaft 170 and internal volume 240 are rigid, the trapped particulate material can raise the contact force between rotatable shaft 170 and internal volume 240 as powder is crushed between the shaft 170 and the internal volume 240. This can raise the torque necessary to turn rotatable shaft 170 beyond acceptable limits. The use of flexible wall 145 can reduce the friction because it provides some flexibility to internal volume 240 in such an event. Flexible wall 145 can be constructed of metal, e.g. aluminum, nickel, steel, titanium, or of a ceramic material, e.g. stabilized zirconia, and is relatively rigid, but with sufficient deformability to accommodate the particles being metered. Similarly, it is possible to achieve the same result if the rotatable shaft is designed to have a small degree of radial flexibility. The embodiment shown in FIG. 8 also includes a scraper edge 260 and a powder collection cavity 270 portion of internal volume 240 that act to remove and collect excess particulate material that has been entrained between rotatable shaft 170 and internal volume 240 outside of circumferential groove 175. Thus, in this embodiment rotatable shaft 170 does not have a shape corresponding to the entire internal volume 240, but rotatable shaft 170 and internal volume 240 do cooperate such that the particulate material is substantially transported by the circumferential groove and not along the remainder of rotatable shaft 170. Any excess particulate material that can be entrained between rotatable shaft 170 and internal volume 240 outside of circumferential groove 175 is not substantially delivered through the second opening and is not substantially received nor vaporized by the flash evaporator. With radial flexibility in internal volume 240 or rotatable shaft 170, it can be advantageous to have a layer of very fine particulate material between internal volume 240 and rotatable shaft 170 as the drive torque is even lower than when the shaft and internal volume are entirely free of powder.

Figure 9:
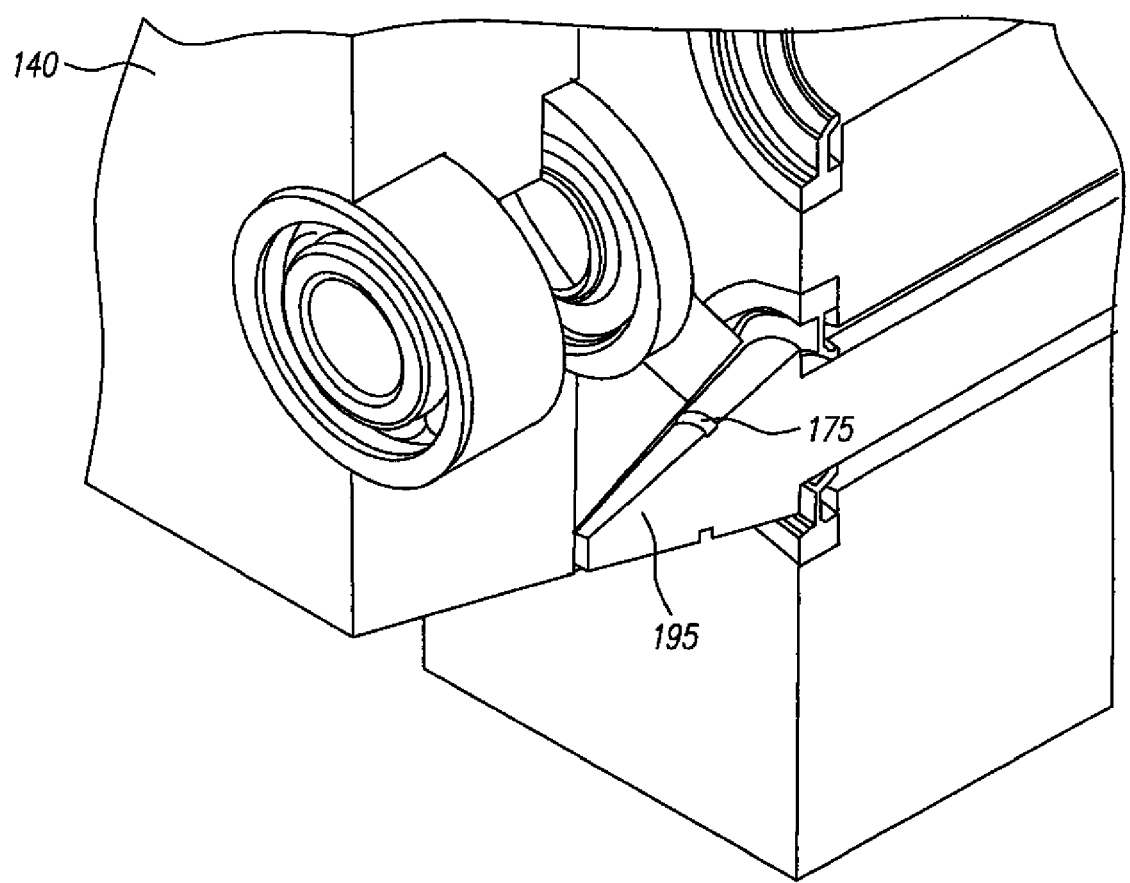
FIG. 9 shows a cutaway view of another embodiment of an apparatus according to the present invention.

Turning now to FIG. 9, there is shown a cutaway view of another embodiment of an apparatus according to the present invention. The shape of the rotatable shaft, and of the internal volume within which it is disposed, is not limited to a cylinder. They can have other shapes, e.g. spherical or conical, one embodiment of which is shown by rotatable shaft 195. The conical shape of rotatable shaft 195 has the advantage of permitting adjustment of the spacing between the rotatable shaft and the housing by changing the axial position of the shaft. The rotatable shaft axial position relative to the internal volume can be adjusted based on the size of the particles to best suit various particulate materials and choose a spacing smaller than the average particle size of the material. This adjustment can be useful when metering different particulate material of varying sizes.

Figure 10:
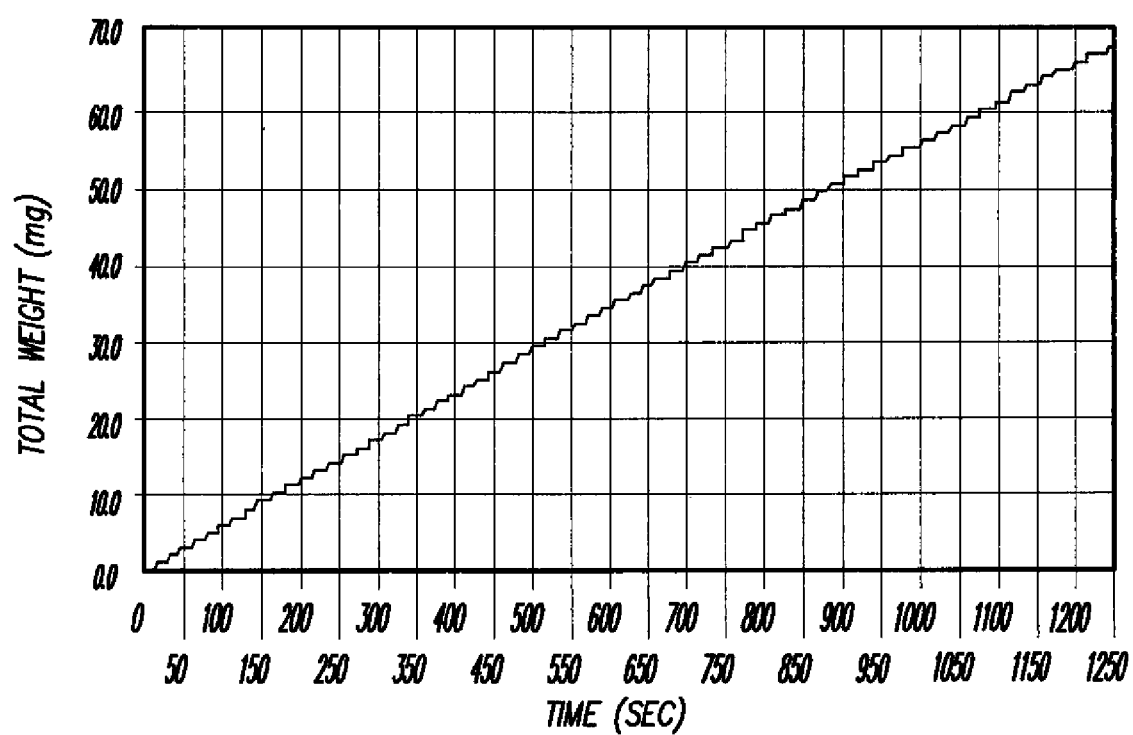
FIG. 10 shows the results of measurement of the accumulated weight of particulate material delivery with time by an apparatus of the present invention.

Turning now to FIG. 10, there is shown the results of measurement of the accumulated weight of particulate material delivery with time by an apparatus of the present invention. The embodiment used to obtain these measurements is shown in FIGS. 3-5. A 6.35 mm diameter cylindrical shaft with a 0.5 mm wide circumferential groove that is 0.35 mm deep was used. FIG. 10 provides a detailed view of particulate material delivery at a rate of 43 μg per second for a shaft rotation speed of 0.1 revolutions per second. The experiment was conducted under reduced pressure conditions of 1 microTorr. A digital electronic balance was used to measure the dispensed powder weight. The digital balance has milligram resolution, not microgram resolution. The trace shows discretization due to the limited resolution of the digital balance, but the trace describes an essentially straight line whose slope indicates an average material feed rate of 43 μg per second at a shaft rotation of 0.1 revolutions per second. In this case, the circumferential groove feeds 430 micrograms per revolution or 1.2 micrograms per degree of shaft rotation. The material feeding test was repeated at a shaft rotation rate of 0.1 revolutions per second for a different particle size range of the same material, and the results are shown in Table 1 (below). The finer particles were observed to feed at nearly twice the rate of the coarser particles, likely due to a higher particle packing fraction in the groove. The experimental measurements were recorded over a long time period to determine the average effective powder metering rate to a resolution better than the milligram digit of the balance.

TABLE 1

| Particle size range | Measured Feed rate (micrograms/sec) | Feed rate per revolution (micrograms) | Feed rate per degree of revolution (micrograms) |
| --- | --- | --- | --- |
| 53μ < 106μ | 76 | 760 | 2.1 |
| 106μ < 212μ | 43 | 430 | 1.2 |

In many applications, this precise metering ability can simplify the control system such that the motor speed or number of motor revolutions alone provides a sufficiently accurate measure of the material feed rate without the need to actually weigh the metered amount of material.

Figure 11A:
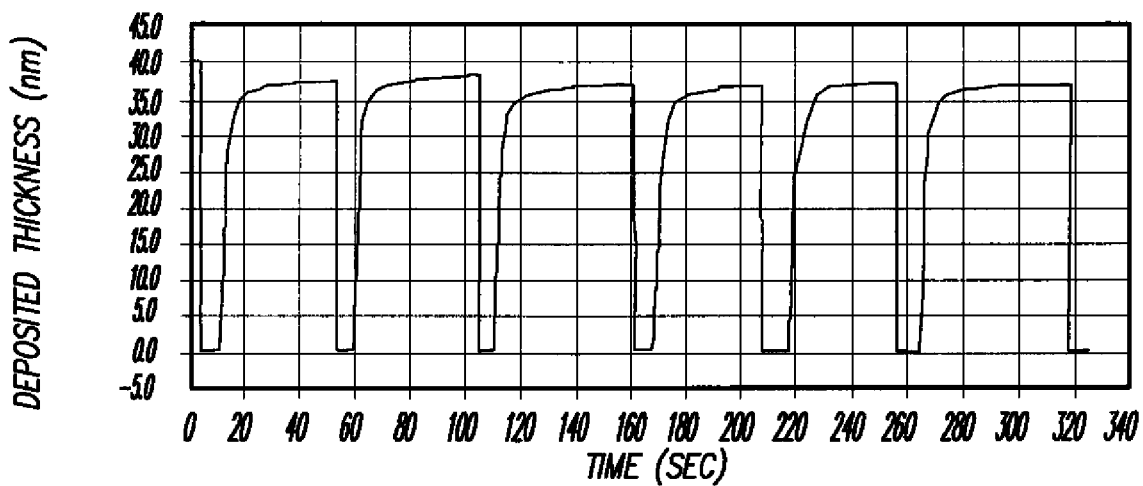
FIG. 11A shows the results of successive measurements of deposited film thickness with time with the present invention.
Figure 11B:
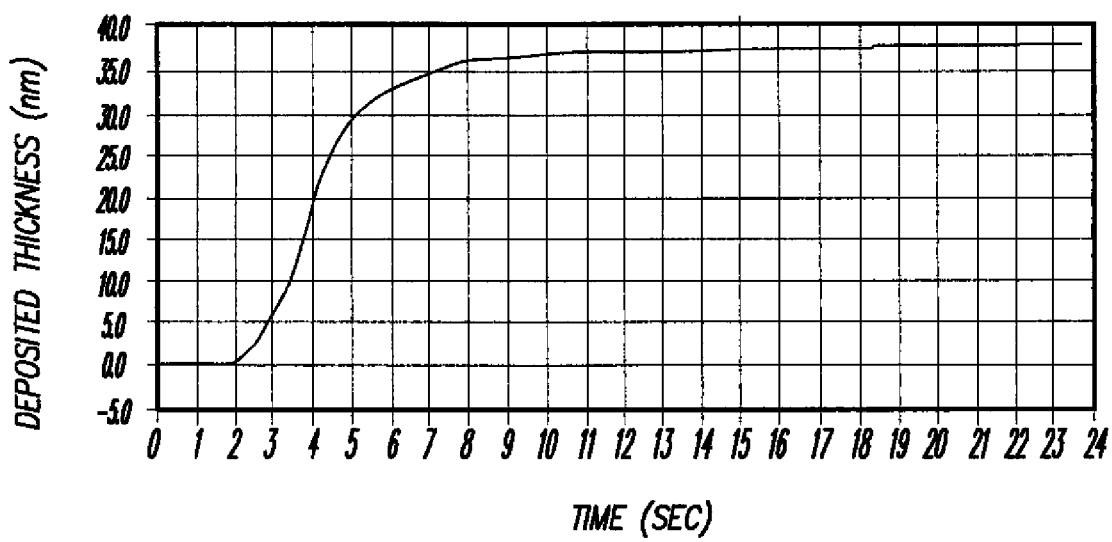
FIG. 11B shows a close-up view of one deposition cycle from FIG. 11A.

Turning now to FIG. 11A, there is shown the results of measurement of deposited film thickness versus time with the present invention when operated in an intermittent feed mode. This shows that vaporization is initiated rapidly and that the terminal deposited thickness is repeatable from cycle to cycle. FIG. 11B is an expanded view of one deposition cycle from FIG. 11A. In this figure, the rotatable shaft metered particulate material for 2 seconds starting at time T=1.5 seconds and then stopped at time T=3.5 seconds. The deposition continued for approximately 15 seconds after the metering stopped and resulted in the deposition of a film having a thickness of 38 nm in a total time of 17 seconds.

Figure 12:
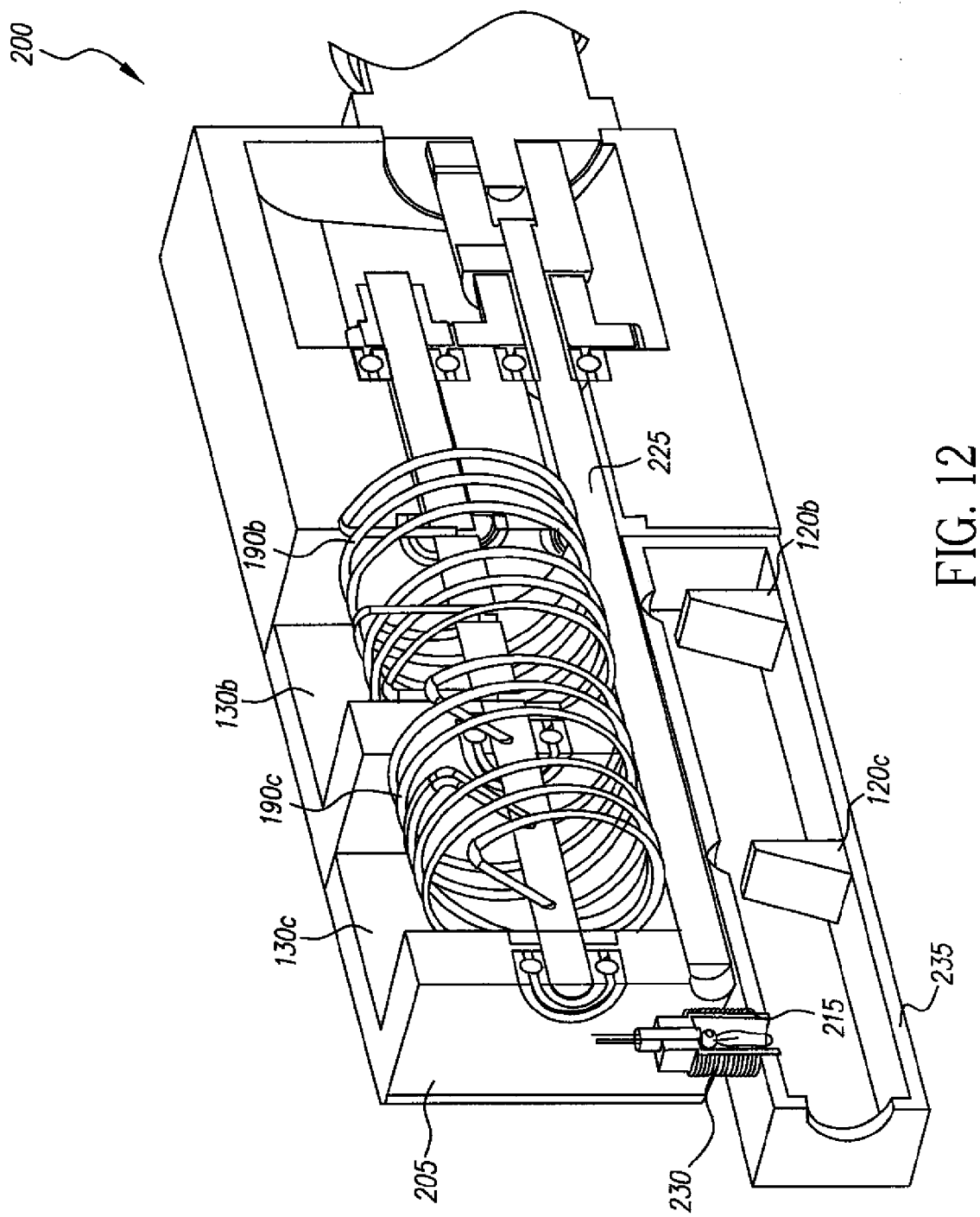
FIG. 12 shows a three-dimensional cross-sectional view of another embodiment of an apparatus according to the present invention.

Turning now to FIG. 12, there is shown a three-dimensional cross-sectional view of another embodiment of an apparatus according to the present invention. Vaporizing apparatus 200 is an apparatus for vaporizing a plurality of particulate materials. Vaporizing apparatus 200 includes two separate metering apparatus, each of which includes: a reservoir for receiving particulate material; a housing having an internal volume and first and second openings; a rotatable shaft disposed in the internal volume having a shape corresponding to that of the internal volume and a circumferential groove; and a scraper having at its end substantially the same cross section as the groove in the rotating shaft. These components will be described in more detail. It includes two reservoirs 130b and 130c for each receiving a different particulate material. Although not shown, reservoirs 130b and 130c can include larger storage and feeding apparatus above them to increase the volume of particulate material that can be loaded. Each reservoir is in housing 205 and includes an agitator (e.g. 190b and 190c) to fluidize the particulate material. Housing 205 also includes an internal volume 215. Rotatable shaft 225 has a smooth surface and a shape corresponding to that of internal volume 215, and is disposed in internal volume 215. Rotatable shaft 225 also has a circumferential groove corresponding to each reservoir. The volume of each circumferential groove can be the same, or can be different for vaporizing different amounts of each different particulate material, e.g. a host and a dopant material. Housing 205 also includes a first and second opening, and a scraper as described above in each second opening, corresponding to each circumferential groove. Thus, rotatable shaft 225 is common to each metering apparatus. Vaporizing apparatus 200 also includes two separate flash evaporators (e.g. 120b and 120cb) within a common evaporator enclosure 235. Each flash evaporator is positioned to receive and vaporize the metered material from its corresponding metering apparatus. In an alternative embodiment the vaporizing apparatus can contain a single flash evaporator that is positioned to receive and vaporize the metered material from both of the metering apparatus. Vaporizing apparatus 200 can further optionally include a pressure sensor 230, which can be used to monitor the rate of material vaporization.

Other embodiments of vaporizing with multiple metering apparatus are also possible. For example, one can employ two side-by-side vaporizing apparatus, such as vaporizing apparatus 100 as shown in FIG. 3, and would thus include a separate rotatable shaft for each metering apparatus. In this embodiment, each circumferential groove can have the same or different volume, thus providing gross control over the relative amounts of each of the different components. Each of the shafts can rotate at different speeds, thus also providing fine control of the relative amounts of the different components.

Figure 13:
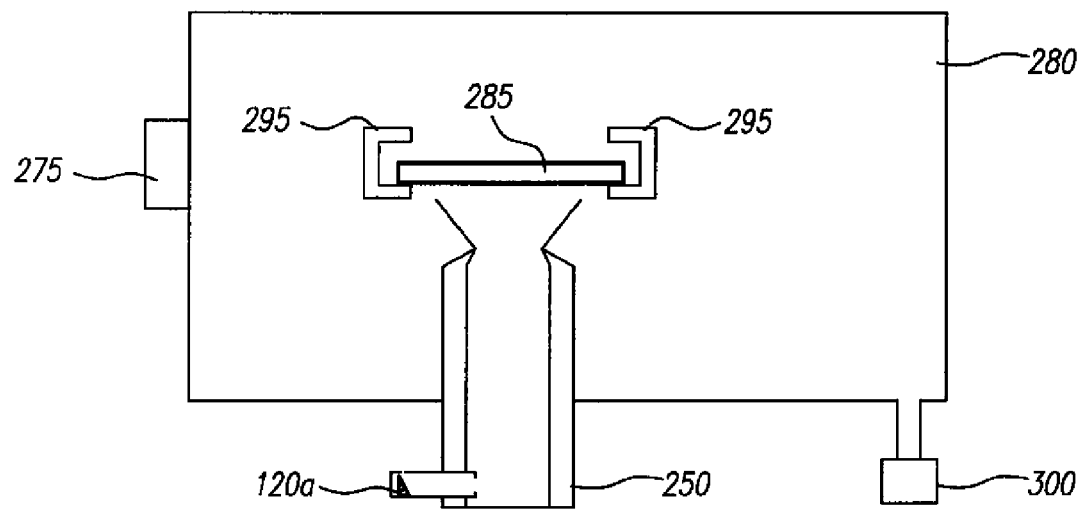
FIG. 13 shows a cross-sectional view of an apparatus of the present invention with a substrate for vapor deposition.

Turning now to FIG. 13, there is shown a cross-sectional view of an apparatus of the present invention with a substrate for vapor deposition and a deposition chamber enclosing the substrate. Deposition chamber 280 is an enclosed apparatus that permits an OLED substrate 285 to be coated with organic material transferred from a manifold 250. Manifold 250 is supplied with organic material via flash evaporator 120a as described above. Other parts of the vaporizing apparatus described above have been left out for clarity of illustration. Deposition chamber 280 is held under controlled conditions, e.g. a pressure of 1 torr or less provided by a vacuum source 300. Deposition chamber 280 includes load lock 275 which can be used to load uncoated OLED substrates 285, and unload coated OLED substrates. OLED substrate 285 can be held by a translational/support apparatus 295 so that manifold 250 provides an even coating of vaporized material to condense and form a layer over the entire surface of OLED substrate 285. Although the vaporization apparatus with a manifold is shown as partially enclosed by deposition chamber 280, it will be understood that other arrangements are possible, including arrangements wherein the entire vaporization apparatus, including any container or containers for holding the particulate material, is completely enclosed by deposition chamber 280.

Figure 14:
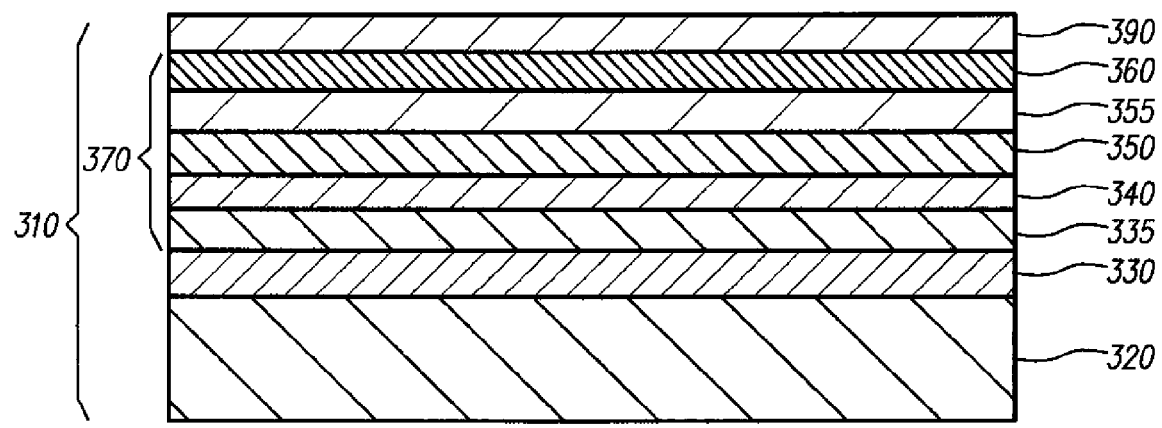
FIG. 14 shows a cross-sectional view of a light-emitting device that can be prepared with an apparatus of the present invention.

Turning now to FIG. 14, there is shown a cross-sectional view of a pixel of a light-emitting OLED device 310 that can be prepared in part with an apparatus of the present invention. The OLED device 310 includes at a minimum a substrate 320, a cathode 390, an anode 330 spaced from cathode 390, and a light-emitting layer 350. The OLED device 300 can also include a hole-injecting layer 335, a hole-transporting layer 340, an electron-transporting layer 355, and an electron-injecting layer 360, as well as other layers well-known to those skilled in the art. Hole-injecting layer 335, hole-transporting layer 340, light-emitting layer 350, electron-transporting layer 355, and electron-injecting layer 360 include a series of organic layers 370 disposed between anode 330 and cathode 390. Organic layers 370 are the organic material layers most desirably deposited by the apparatus of this invention. These components will be described in more detail.

Substrate 320 can be an organic solid, an inorganic solid, or a combination of organic and inorganic solids. Substrate 320 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 320 can be a homogeneous mixture of materials, a composite of materials, or multiple layers of materials. Substrate 320 can be an OLED substrate, that is a substrate commonly used for preparing OLED devices, e.g. active-matrix low-temperature polysilicon or amorphous-silicon TFT substrate. The substrate 320 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

An electrode is formed over substrate 320 and is most commonly configured as an anode 330. When EL emission is viewed through the substrate 320, anode 330 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable way such as evaporation, sputtering, chemical vapor deposition, or electrochemical process. Anode materials can be patterned using well known photolithographic processes.

While not always necessary, it is often useful that a hole-injecting layer 335 be formed over anode 330 in an organic light-emitting display. The hole-injecting material can serve to improve the film formation property of subsequent organic layers and to facilitate injection of holes into the hole-transporting layer. Suitable materials for use in hole-injecting layer 335 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1.

While not always necessary, it is often useful that a hole-transporting layer 340 be formed and disposed over anode 330. Desired hole-transporting materials can be deposited by any suitable way such as evaporation, sputtering, chemical vapor deposition, electrochemical process, thermal transfer, or laser thermal transfer from a donor material, and can be deposited by the device and method described herein. Hole-transporting materials useful in hole-transporting layer 340 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals or including at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

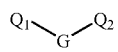

A wherein:
$Q_1$ and $Q_2$ are independently selected aromatic tertiary amine moieties; and
G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

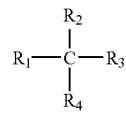

B where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C.

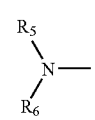

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

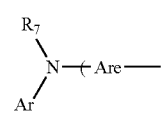

D wherein:
each Ar is an independently selected arylene group, such as a phenylene or anthracene moiety;
n is an integer of from 1 to 4; and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. The device and method described herein can be used to deposit single- or multi-component layers, and can be used to sequentially deposit multiple layers.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 350 produces light in response to hole-electron recombination. Light-emitting layer 350 is commonly disposed over hole-transporting layer 340. Desired organic light-emitting materials can be deposited by any suitable way such as evaporation, sputtering, chemical vapor deposition, electrochemical process, or radiation thermal transfer from a donor material, and can be deposited by the device and method described herein. Useful organic light-emitting materials are well known. As more fully described in U.S. Pat. Nos. 4,769,292 and 5,935,721, the light-emitting layers of the organic EL element include a luminescent or fluorescent material where electroluminescence is produced as a result of electron-hole pair recombination in this region. The light-emitting layers can include a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. The device and method described herein can be used to coat multi-component guest/host layers without the need for multiple vaporization sources.

Host and emitting molecules known to be of use include, but are not limited to, those disclosed in U.S. Pat. Nos. 4,768, 292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

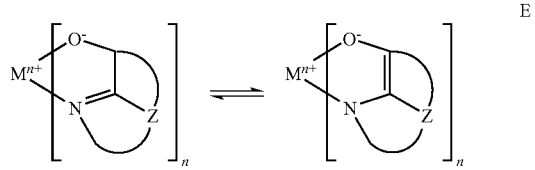

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed. Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in light-emitting layer 350 can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distryrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful that OLED device 310 includes an electron-transporting layer 355 disposed over light-emitting layer 350. Desired electron-transporting materials can be deposited by any suitable way such as evaporation, sputtering, chemical vapor deposition, electrochemical process, thermal transfer, or laser thermal transfer from a donor material, and can be deposited by the device and method described herein. Preferred electron-transporting materials for use in electron-transporting layer 355 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

An electron-injecting layer 360 can also be present between the cathode and the electron-transporting layer. Examples of electron-injecting materials include alkaline or alkaline earth metals, alkali halide salts, such as LiF mentioned above, or alkaline or alkaline earth metal doped organic layers.

Cathode 390 is formed over the electron-transporting layer 355 or over light-emitting layer 350 if an electron-transporting layer is not used. When light emission is through the anode 330, the cathode material can include nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material includes a Mg:Ag alloy wherein the percentage of silver is in the range of 1 to 20%, as described in U.S. Pat. No. 4,885,221. Another suitable class of cathode materials includes bilayers including a thin layer of a low work function metal or metal salt capped with a thicker layer of conductive metal. One such cathode includes a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through cathode 390, it must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The invention has been described in detail with particular reference to certain preferred embodiments thereof, but it will be understood that variations and modifications can be effected within the spirit and scope of the invention.

PARTS LIST 5 auger screw
7 smooth barrel
8 auger structure
9 thread-free portion
10 vaporization device
11 source
12 source
13 source
14 vapor plume
15 substrate
100 vaporizing apparatus
120a flash evaporator
120b flash evaporator
120c flash evaporator
125 wedge-shaped entrance
130a reservoir
130b reservoir
130c reservoir
135 wedge-shaped entrance
140 housing
145 flexible wall
150 internal volume
155 first opening
160 second opening
170 rotatable shaft
175 circumferential groove
180 motor
185 scraper Parts List Cont'd
190a agitator
190b agitator
190c agitator
195 rotatable shaft
200 vaporizing apparatus
205 housing
210 evaporator enclosure
215 internal volume
220 insulator
225 rotatable shaft
230 pressure sensor
235 evaporator enclosure
240 internal volume
250 manifold
260 scraper edge
270 cavity
275 load lock
280 deposition chamber
285 OLED substrate
295 translational/support apparatus
300 vacuum source
310 OLED device
320 substrate
330 anode
335 hole-injecting layer
340 hole-transporting layer Parts List Cont'd
350 light-emitting layer
355 electron-transporting layer
360 electron-injecting layer
370 organic layers
390 cathode

The invention claimed is:

1. An apparatus for vaporizing a particulate material, comprising:
 (a) a metering apparatus including:
  (i) a reservoir for receiving particulate material;
  (ii) a housing having an internal volume and having first and second openings for respectively receiving the particulate material from the reservoir and for discharging the particulate material;
  (iii) a rotatable shaft disposed in the internal volume, the shaft having a smooth surface and a circumferential groove aligned with the first and second openings for receiving particulate material from the reservoir and for discharging the particulate material;
  (iv) the rotatable shaft and the internal volume cooperating such that the particulate material is substantially transported by the circumferential groove and not along the remainder of the rotatable shaft; and
  (v) a scraper disposed in relation to the second opening, having at its end substantially the same cross section as the groove in the rotating shaft, the scraper cooperating with the groove to dislodge particulate material retained therein, and in response to the shaft rotating, delivers metered amounts of particulate material through the second opening; and (b) a flash evaporator that receives and vaporizes the metered material.

2. The apparatus of claim 1 further including a device disposed in the reservoir for filling and compressing the particulate material in the groove.

3. The apparatus of claim 2 wherein the apparatus includes an agitator that fluidizes the particulate material in the reservoir and sweeps particulate material into the groove at the first opening.

4. The apparatus of claim 1 wherein the scraper is heated.

5. The apparatus of claim 1 wherein the reservoir and the housing are actively cooled.

6. The apparatus of claim 1 wherein there is only a single groove.

7. The apparatus of claim 1 further including a flexible wall and wherein the flexible wall provides at least a portion of the perimeter of the internal volume.

8. The apparatus of claim 1 wherein the width of the groove is in the range of 0.01 to 2 mm.

9. The apparatus of claim 1 wherein the depth of the groove is from 0.01 to 5 mm.

10. An apparatus for vaporizing a plurality of particulate materials, comprising:

(a) two separate metering apparatus, each including:

(i) a reservoir for receiving particulate material;

(ii) a housing having an internal volume and having first and second openings for respectively receiving the particulate material from the reservoir and for discharging the particulate material;

(iii) a rotatable shaft disposed in the internal volume, the shaft having a smooth surface and a circumferential groove aligned with the first and second openings for receiving particulate material from the reservoir and for discharging the particulate material;

(iv) the rotatable shaft and the internal volume cooperating such that the particulate material is substantially transported by the circumferential groove and not along the remainder of the rotatable shaft; and (v) a scraper disposed in relation to the second opening, having at its end, substantially the same cross section as the groove in the rotating shaft, the scraper cooperating with the groove to dislodge particulate material retained therein, and in response to the shaft rotating, delivers metered amounts of particulate material through the second opening; and (b) flash evaporator means that receives and vaporizes the metered material from each metering apparatus.

11. The apparatus of claim 10 wherein the rotatable shaft is common to each metering apparatus.

12. The apparatus of claim 10 wherein the flash evaporator means includes two separate flash evaporators respectively receiving and vaporizing the metered particulate material from the two metering apparatus.

13. The apparatus of claim 10 wherein the grooves in the two metering apparatus have different volumes.

14. The apparatus of claim 10 wherein the shafts in the two metering apparatus rotate at different speeds.

15. The apparatus of claim 10 wherein each metering apparatus further includes a flexible wall and wherein the flexible wall provides at least a portion of the perimeter of the internal volume.

16. The apparatus of claim 10 wherein the width of the groove is in the range of 0.01 to 2 mm.

17. The apparatus of claim 10 wherein the depth of the groove is from 0.01 to 5 mm.

* * * * *